(12) United States Patent
Huang et al.

(10) Patent No.: US 8,388,852 B2
(45) Date of Patent: Mar. 5, 2013

(54) METHOD FOR FABRICATING TOUCH SENSOR PANELS

(75) Inventors: Lili Huang, San Jose, CA (US); Siddharth Mohapatra, Santa Clara, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 210 days.

(21) Appl. No.: 12/848,049

(22) Filed: Jul. 30, 2010

(65) Prior Publication Data

US 2012/0024816 A1 Feb. 2, 2012

(51) Int. Cl.
*B44C 1/22* (2006.01)
(52) U.S. Cl. .............. 216/43; 216/13; 216/40; 438/725; 438/100
(58) Field of Classification Search .................... 216/24, 216/26, 40, 43, 95, 100, 13, 33; 438/717, 438/723, 725, 742
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 8,038,125 B2 * | 10/2011 | Troy et al. .................... | 254/338 |
| 2005/0116629 A1 | 6/2005 | Takamura et al. | |
| 2006/0026521 A1 | 2/2006 | Hotelling et al. | |
| 2006/0197753 A1 | 9/2006 | Hotelling | |
| 2007/0004101 A1 * | 1/2007 | Lim ............................. | 438/149 |
| 2008/0277259 A1 | 11/2008 | Chang | |
| 2009/0148987 A1 * | 6/2009 | Liao et al. .................... | 438/158 |
| 2010/0073310 A1 | 3/2010 | Liang et al. | |
| 2011/0043383 A1 * | 2/2011 | Kang et al. ..................... | 341/5 |

FOREIGN PATENT DOCUMENTS

| | | |
|---|---|---|
| JP | 2000-163031 A | 6/2000 |
| JP | 2002-342033 A | 11/2002 |
| WO | WO-2012/015703 A1 | 2/2012 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

(Continued)

*Primary Examiner* — Lan Vinh
(74) *Attorney, Agent, or Firm* — Morrison & Foerster LLP

(57) ABSTRACT

A method for fabricating a touch sensor panel is disclosed. The method includes providing a substrate for the touch sensor panel, depositing a conductive material layer on a top surface of the substrate, depositing a metal layer on top of the conductive material layer, affixing a resist to a first area of the metal layer, the resist also adapted to serve as a passivation layer during passivation, removing metal from the metal layer outside of the first area; and performing passivation on the substrate while leaving the affixed resist intact.

25 Claims, 10 Drawing Sheets

OTHER PUBLICATIONS

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

International Search Report mailed Nov. 2, 2011, for PCT Application No. PCT/US2011/045113, filed Jul. 22, 2011, three pages.

* cited by examiner

METHOD FOR FABRICATING TOUCH SENSOR PANELS

FIELD

This relates generally to the fabrication of touch sensor panels, and more particularly, to a system and method for improving the touch sensor panel fabrication process using a resist which serves as both a mask during a lithography/etch (litho/etch) patterning process and a passivation layer during the subsequent passivation process.

BACKGROUND

In recent years, touch sensor panels, touch screens, and the like have become available as input devices. Touch screens, in particular, are becoming increasingly popular because of their ease and versatility of operation as well as their declining price. Touch screens can include a touch sensor panel, which can be a clear panel with a touch-sensitive surface, and a display device, such as an LCD panel, that can be positioned partially or fully behind the touch sensor panel so that the touch-sensitive surface can cover at least a portion of the viewable area of the display device. In some devices, the touch screen is protected by a cover glass. Touch screens can allow a user to perform various functions by touching the touch sensor panel using a finger, stylus or other object at a location often dictated by a user interface (UI) being displayed by the display device. In general, touch screens can recognize a touch event and the position of the touch event on the touch sensor panel, and a computing system can then interpret the touch event in accordance with the display appearing at the time of the touch event, and thereafter can perform one or more actions based on the touch event.

Like LCD panels, touch sensor panels in touch screens may be made of glass or other suitable transparent substrate. In some configurations, touch sensor panels can be implemented as an array of pixels formed by multiple drive lines (e.g. rows) crossing over multiple sense lines (e.g. columns), where the drive and sense lines are separated by a dielectric material. In some touch sensor panels, the drive and sense lines can be formed on the top and bottom sides of the same transparent substrate. In other touch sensor panels, the drive and sense lines may be formed on one side of the transparent substrate. The sense lines and drive lines can be formed from a substantially transparent material such as Indium Tin Oxide (ITO), although other materials can also be used. The ITO layer(s) can be deposited on one or both sides of the transparent substrate. Touch sensor panels with double or single sided ITO layers are referred to as double-sided ITO (DITO) touch sensor panels and single-sided ITO (SITO) touch sensor panels, respectively, in this document. DITO and SITO touch sensor panels are widely used in a wide-range of electronic devices, such as tablet PCs, digital music players, cellular telephones, and other wireless handheld devices.

The existing methods of fabricating touch sensor panels require multiple printing steps during the litho/etch patterning process and the subsequent passivation process. The traditional litho/etch process can be expensive because of high equipment and material cost. Thus, it is desirable to reduce the number of printing steps in the fabrication process to reduce the overall manufacturing cost of a touch sensor panel.

SUMMARY

This relates to methods for fabricating touch sensor panels. In some touch sensor panel fabrication processes, a photoresist is applied to the panel during a litho/etch patterning process. The photoresist is stripped after the completion of the litho/etching patterning process. A separate passivation layer is then applied for the subsequent passivation process. Thus, the overall fabrication process is lengthy and inefficient. The equipment and material cost is also relatively high due to the multiple printing and etching steps. Embodiments of the present disclosure seek to eliminate some of those steps by applying a resist that can serve as a mask during etching process and remain permanently as a passivation layer after the etching process. This improved process can eliminate a number of steps of the existing fabrication process and reduce equipment and material cost.

In one embodiment of the disclosure, first, an ITO (or other conductive material) layer and a metal layer can be deposited on one or both surfaces of a base substrate. Next, a litho/etch process can be performed to pattern both the ITO and metal layers to form drive and sense elements of the touch sensor panel, although in other embodiments processes other than litho/etch may also be used to remove the patterns. These first two steps can be the same as those in the existing fabrication process. Then, a resist/passivation material can be placed over the edge area of the touch sensor panel to protect metal patterns in that area during the subsequent litho/etch process. This resist/passivation material can be different from the photoresist typically used in that this particular material may act not only as a mask during litho/etching but also as a passivation layer during passivation. After this dual-purpose material is put in place, a second litho/etch process can be performed to remove metal from the viewing area of the panel, although in other embodiments processes other than litho/etch may also be used to remove the metal. Because the same material can also serve as the passivation layer, passivation can be carried out without requiring additional steps of removing the photoresist and placing a passivation layer over the edge area or the entire surface first.

In general, embodiments of the disclosure can reduce the number of steps required in the fabrication process of a touch sensor panel. More importantly, by using a single material as both the photoresist mask during the litho/etch process and the passivation layer during passivation, it can reduce material cost and operation cost associated with the printing and removing of extra material in the fabrication process. As a result, the overall fabrication process can be more efficient and the overall cost of the finished device including the touch sensor panel can be reduced.

DETAILED DESCRIPTION OF THE PREFERRED EMBODIMENTS

In the following description of preferred embodiments, reference is made to the accompanying drawings which form a part hereof, and in which it is shown by way of illustration specific embodiments which can be practiced. It is to be understood that other embodiments can be used and structural changes can be made without departing from the scope of the embodiments of this disclosure.

This relates to methods for fabricating touch sensor panels. In some touch sensor panel fabrication processes, a photoresist is applied to the panel during a litho/etch patterning process. The photoresist is stripped after the completion of the litho/etching patterning process. A separate passivation layer is then applied for the subsequent passivation process. Thus, the overall fabrication process is lengthy and inefficient. The equipment and material cost is also relatively high due to the multiple printing and etching steps. Embodiments of the present disclosure seek to eliminate some of those steps by applying a resist that can serve as a mask during etching process and remain permanently as a passivation layer after the etching process. This improved process can eliminate a number of steps of the existing fabrication process and reduce equipment and material cost.

Figure 1:
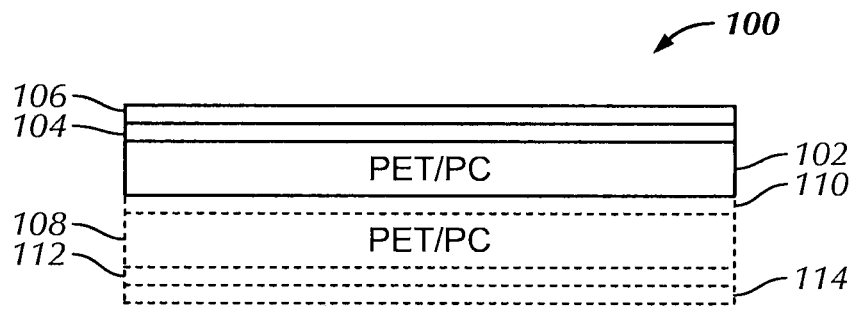
FIG. 1 illustrates an exemplary stacked structure of a touch sensor panel.

The structure of a capacitive touch sensor panel is illustrated in FIG. 1. The touch sensor panel 100 can include a base substrate 102. The base substrate can be flexible material such as polyethylene terephthalate (PET) or polycarbonate (PC). In some embodiments, rigid material such as glass can also be used as the base substrate. As illustrated in FIG. 1, an ITO (or other conductive material) layer 104 can be deposited on the top surface of the base substrate 102. The ITO layer 104 can later be patterned to form sense lines and/or drive lines of the touch sensor panel 100. Deposited on top of the ITO layer 104 is a metal layer 106 for forming routing traces on the touch sensor panel 100. The metal layer 106 can be made of copper or any other metal suitable for routing signals detected by the sense lines to a circuit (not shown in FIG. 1) attached to the touch sensor panel 110 for further processing. The ITO layer 104 and the metal layer 106 can be deposited back-to-back, in succession, or simultaneously onto the base substrate 102.

A SITO touch sensor panel can be fabricated using the above-described stacked structure including a metal layer 106 and an ITO (or other conductive material) layer 104 deposited on top of the base substrate 102. Optionally, additional layers (shown in dotted lines in FIG. 1) can be added to this stacked structure to form the underlying structure of a DITO touch sensor panel. As previously mentioned, a DITO touch sensor panel typically has drive lines and sense lines formed on opposite surfaces of the base substrate. In the example embodiment shown in FIG. 1, the bottom surface of the base substrate 102 can be affixed to a second base substrate 108 with an adhesive (e.g. optically clear adhesive (OCA)) layer 110 between the two base substrates 102, 108. The second base substrate 108 can also be made of material such as PET, PC, glass, or other suitable material. An ITO (or other conductive material) layer 112 and a metal layer 114 can be deposited on the bottom surface of the second base substrate 108 in the same fashion described above with respect to the top surface of the base substrate 102. The resulting stacked structure, as shown in FIG. 1, includes the laminated base substrates 102, 108 in the middle and ITO (or other conductive material) layers 104, 112 and metal layers 106, 114 on both the top and bottom surfaces of the laminate.

In the some touch sensor panel fabrication processes, a number of additional patterning and passivation steps must be carried out to further process the laminate of FIG. 1 to form a touch sensor panel. FIGS. 2-5 provide an example step-by-step illustration of the remaining processes. Although only the top half of the stacked structure of FIG. 1 is illustrated in FIGS. 2-5 and the description is only provided for processing of the top half, it should be understood that the bottom half of the stacked structure can be processed in a similar fashion as the top half, either simultaneously or after the top half is processed.

Figure 2:
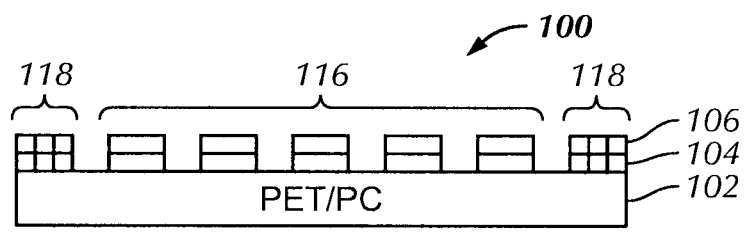
FIGS. 2-5 provide a step-by-step illustration of the exemplary steps of an existing touch sensor panel fabrication process.

FIG. 2 shows the stacked structure of FIG. 1 after an initial litho/etch patterning of the ITO (or other conductive material) layer 104 and the metal layer 106 to form drive and sense elements of the touch sensor panel. As illustrated, thin film patterns of both layers 104, 106 can be formed as a result of this initial patterning step. In particular, the patterns in the viewing area 116 of the panel can be used as conductive traces (i.e., drive lines or sense lines) of the touch sensor panel 100. The metal patterns in the edge area 118 of the panel can be used as routing traces for routing signals to a flex circuit (not shown). This initial step can be performed with any well-known litho/etch technique.

Figure 3:
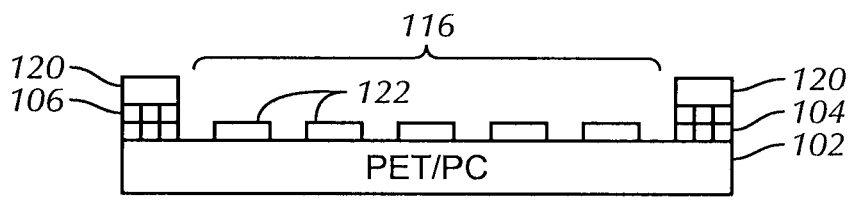

In the next step illustrated in FIG. 3, the remaining metal patterns in the viewing area 116 of the touch sensor panel 100 (for embodiments in which layer 104 is transparent) can be removed so that the viewing area 116 can be transparent. In the existing process, a strip of photoresist 120 can be printed over the edge area 118 (e.g., the area surrounding the viewing area) on the surface of the panel 100 to protect the metal traces in that area. Depending on the type of litho/etch process being performed, other types of resist such as heat resist can also be used. Thereafter, metal etching can be performed to remove all residue metal in the viewing area 116 which is not protected by the photoresist 120. As a result, only patterns of ITO 122 are left in the viewing area 116.

Figure 4:
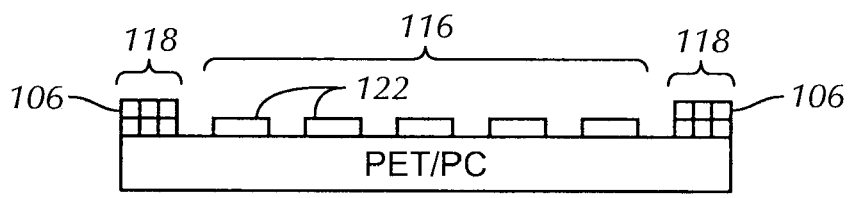

In the next step, as illustrated in FIG. 4, the photoresist strip can be removed from the edge area 118 of the touch sensor panel, exposing the protected metal patterns 106. Only the transparent ITO patterns 122 may remain in the viewing area 116.

Figure 5:
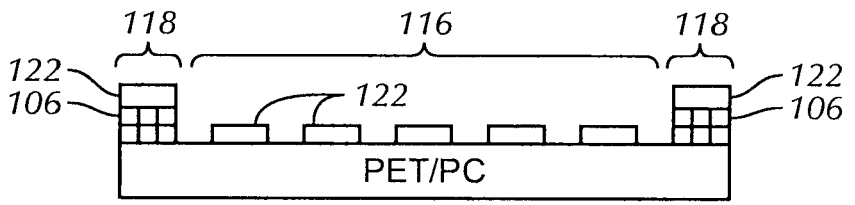

Then, the touch sensor panel undergoes a passivation step. Before passivation can be performed, a passivation layer 122 can be laid either over the edge area 118 on top of the metal traces 106 (as shown in FIG. 5) or over the entire surface of the touch sensor panel including both the viewing area 116 and the edge area 118. Passivation can be carried out once the passivation layer 122 is put in place.

Figure 6:
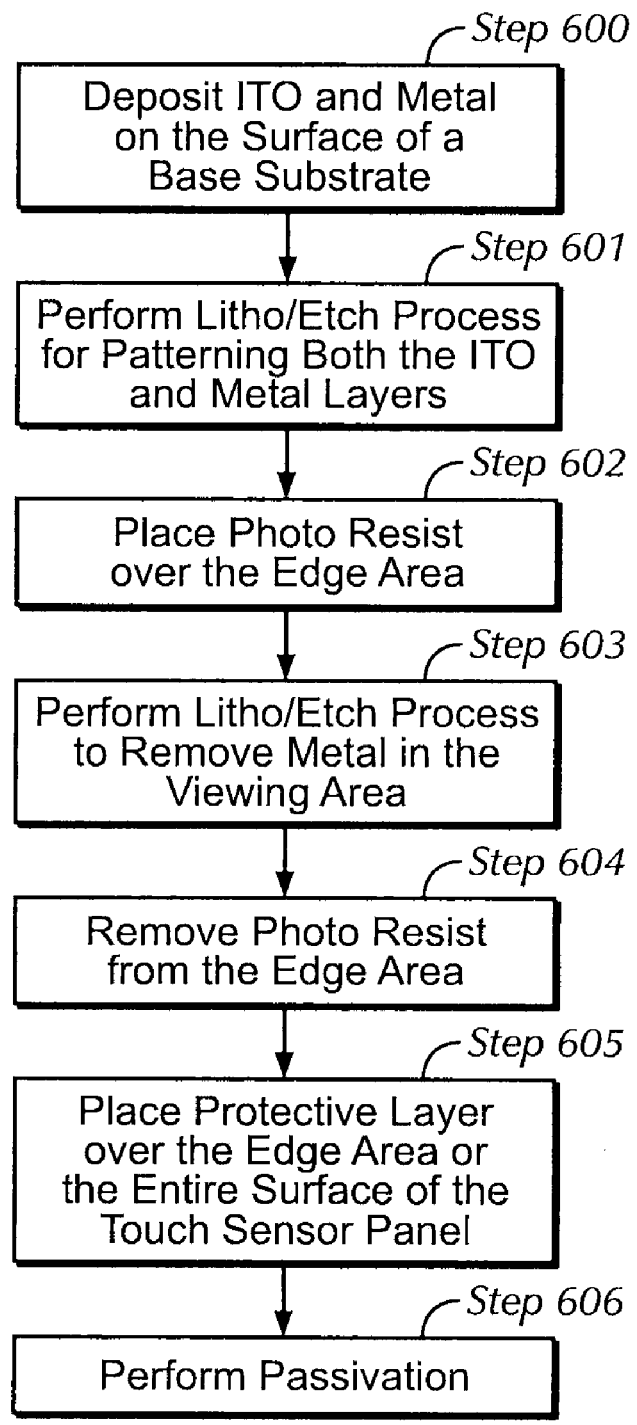
FIG. 6 is a flow chart illustrating the steps of the fabrication process shown in FIGS. 2-5.

FIG. 6 provides a flow chart summarizing the steps of the fabrication process described above. First, an ITO (or other conductive material) layer and a metal layer can be deposited on a surface of a base substrate (step 600). Next, a litho/etch process can be performed to pattern both the ITO and metal layers to form sense and drive elements and routing traces (step 601). Then, a photoresist can be placed over the edge area of the surface of the touch sensor panel to protect metal patterns in that area (step 602). A second litho/etch step can be performed to remove the remaining metal in the viewing area of the touch sensor panel (step 603). Thereafter, the photoresist can be removed from the edge area, uncovering the metal patterns underneath. A separate passivation layer can be placed either over the edge area or the entire surface of the touch sensor panel (step 604) before passivation is performed on the touch sensor panel (step 605).

As detailed above, the above-described touch sensor panel fabrication process requires a number of steps which could make the process lengthy and inefficient. Another drawback of the above-described method is that the equipment and material cost may be high at least due to the fact that the photoresist has to be applied and removed and the passivation layer is then separately applied. Embodiments of the present disclosure simplify the above-described process by reducing the number of steps and the associated material cost by using a single material to serve as both the resist in the litho/etch process and as the passivation layer during passivation.

Figure 7:
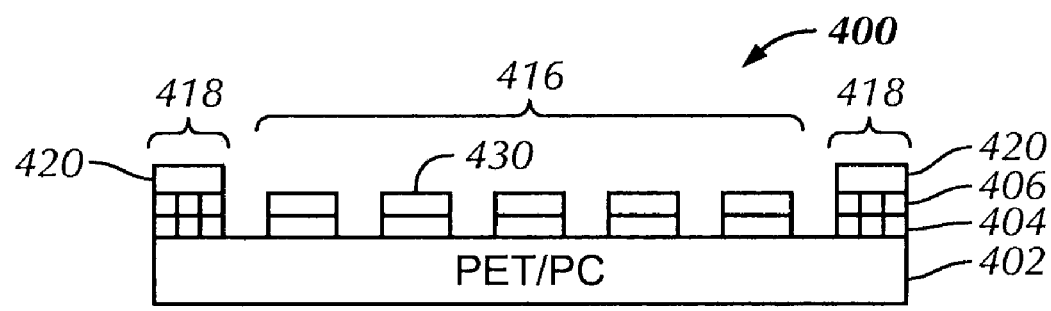
FIGS. 7 and 8 illustrate the exemplary steps of a touch sensor panel fabrication process according to embodiments of the disclosure.

In one embodiment, the fabrication process starts with the same litho/etch patterning step of the metal layer and ITO (or other conductive material) layer on one or both surfaces of the layer structure as shown in FIG. 2, although in other embodiments processes other than litho/etch may also be used to form the patterns. Next, instead of placing a strip of photoresist (or other types of resist, depending on the etching method) over the edge area of the touch sensor panel to protect the metal traces along the edge during etching, as shown in FIG. 3, a resist/passivation material 420 which can serve both as a photoresist (or other types of resist, depending on the etching method) as well as a passivation layer is placed over the edge area 418 of the panel 400, as shown in FIG. 7. The resist/passivation material 420 can, for example, be a dry film resist (DFR) such as one from the Riston® series from DuPont imaging materials or the SUNFORT® series from Asahi Kasei e-materials or any other suitable material that can serve as both a resist and a passivation material. The resist/passivation material 420 can be printed onto the edge area by well known printing methods such as screen printing and the DFR method. The resist/passivation material 420 can cover the patterned metal traces 406 in the edge area of the touch sensor panel, but can leave the metal patterns 430 in the viewing area 416 exposed without any protection.

Figure 8:
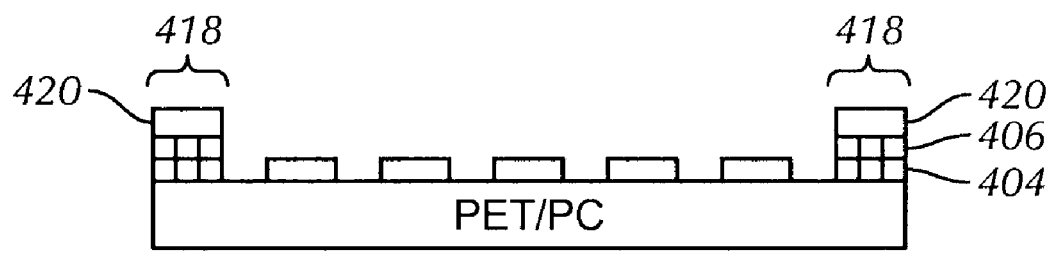

In the next step, as shown in FIG. 8, a second litho/etch step can be performed to remove the metal patterns 430 in the viewing area 416 of the panel 400, although in other embodiments processes other than litho/etch may also be used to remove the patterns. Because the resist/passivation material 420 can act as a photoresist, the metal traces 406 in the edge area 418 are not etched off. This step is similar to the step illustrated in FIG. 3.

With the method described above, the next two steps as shown in FIGS. 4 and 5 would be removing the photoresist from the edge area and then placing a passivation layer for the passivation step. In contrast, because the resist/passivation material 420 can also act as the passivation layer, the steps of removing the photoresist and placing the passivation layer of the existing method can be eliminated. Thus, the resist/passivation material 420 stays permanently over the edge area 418 without being removed or replaced. That is, passivation can take place following the second litho/etch step without any extra steps in between.

Figure 9:
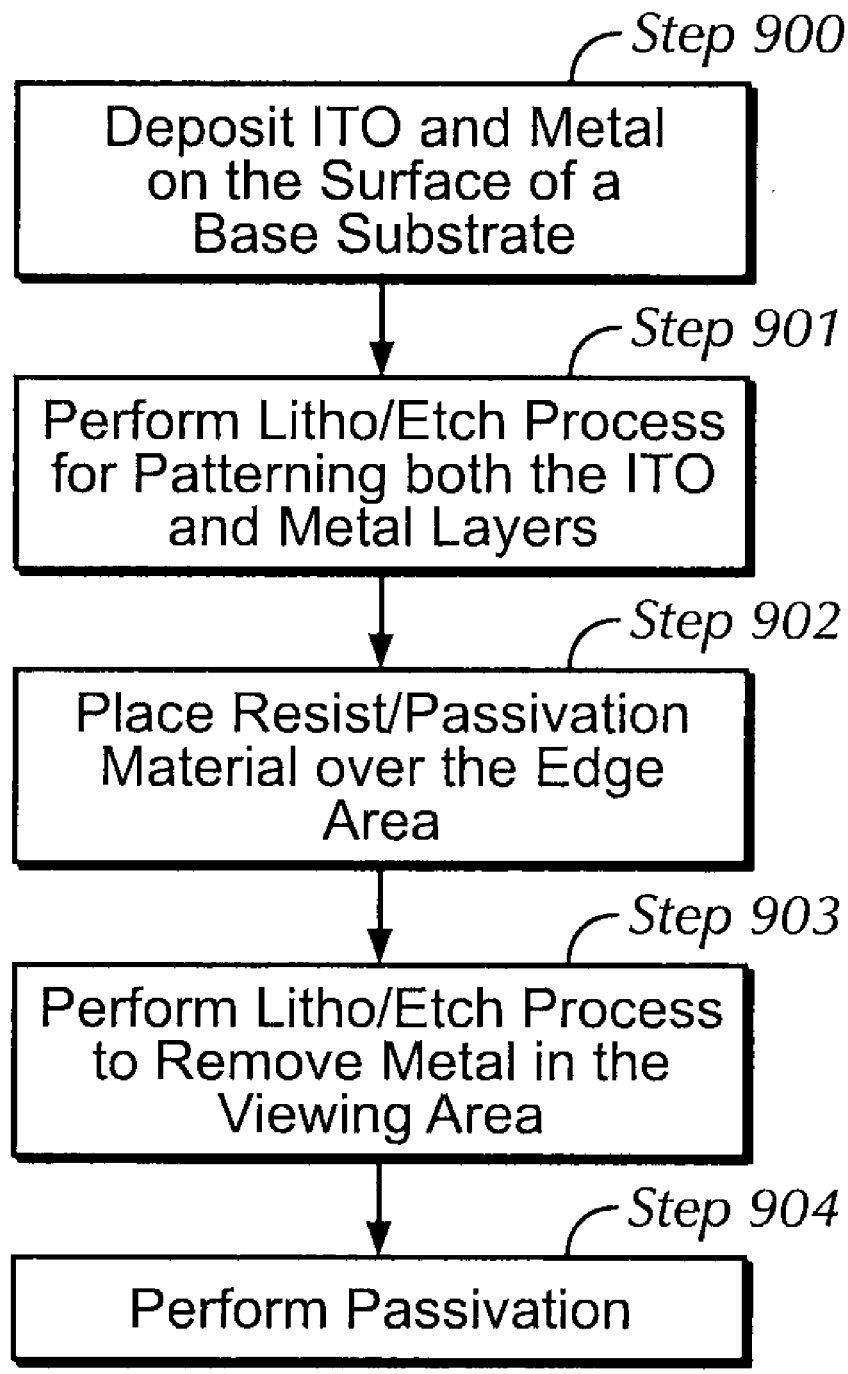
FIG. 9 is a flow chart illustrating the steps of fabrication process according to embodiments of the disclosure

FIG. 9 is a flow chart illustrating the exemplary steps of the touch sensor panel fabrication process according to the embodiment discussed above. First, an ITO (or other conductive material) layer and a metal layer can be deposited on one or both surfaces of a base substrate (step 900). Next, a litho/etch process can be performed to pattern both the ITO and metal layers to form drive and sense elements of the touch sensor panel (step 901), although in other embodiments processes other than litho/etch may also be used to remove the patterns. These first two steps can be the same as those in the existing fabrication process (see for example, steps 600 and 601 in FIG. 6). Then, a resist/passivation material can be placed over the edge area of the touch sensor panel to protect metal patterns in that area during the subsequent litho/etch process (step 902). This resist/passivation material can be different from the photoresist typically used in that this particular material may act not only as a mask during litho/etching but also as a passivation layer during passivation. After this dual-purpose material is put in place, a second litho/etch process can be performed to remove metal from the viewing area of the panel (step 903), although in other embodiments processes other than litho/etch may also be used to remove the metal. Because the same material can also serve as the passivation layer, passivation can be carried out without requiring additional steps of removing the photoresist and placing a passivation layer over the edge area or the entire surface first (step 904).

In general, embodiments of the disclosure can reduce the number of steps required in the fabrication process of a touch sensor panel. More importantly, by using a single material as both the photoresist mask during the litho/etch process and the passivation layer during passivation, it can reduce material cost and operation cost associated with the printing and removing of extra material in the fabrication process. As a result, the overall fabrication process can be more efficient and the overall cost of the finished device including the touch sensor panel can be reduced.

As previously mentioned, the signals detected by touch sensor panel can be routed to a flex circuit for further processing to determine, for example, the properties and locations of the one or more touches detected on the touch sensor panel. In one embodiment, the signals can be routed to a flex circuit bonded to a region near or within the edge area of the panel. The flex circuit can typically be bonded to either the metal layer or the ITO (or other conductive material) layer of the panel. However, it may be difficult or impossible to bond the flex circuit to the panel once the surface of the touch sensor panel is subject to passivation and a passivation layer has been deposited on top of the metal layer and the ITO layer. In the embodiment described above, the material being used as both the resist and the passivation layer can remain permanently over the edge area once it is deposited. That is, the material may not be removed or replaced prior to passivation to allow the potential bonding areas to be preserved. Consequently, there may be an issue with bonding the flex circuit with the metal/ITO layers underneath the resist. Three different solutions are provided below to resolve this issue by ensuring that the bonding area is preserved in the process even though the resist/passivation layer is permanently placed over the edge area of the panel.

The first embodiment involves printing a temporary bond mask over the bonding area prior to printing the resist/passivation material over the same area. FIGS. 10-14 provide a step-by-step illustration of this method.

Figure 10:
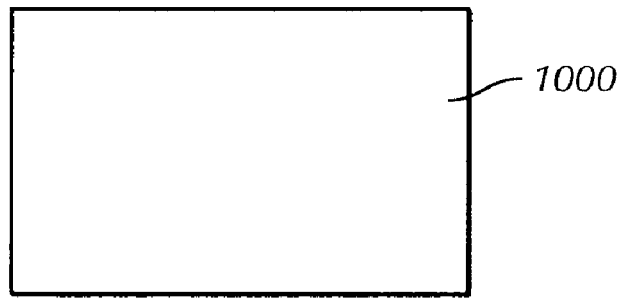
FIG. 10-14 illustrate the exemplary steps of a method of preserving a bonding area for flex bonding during the fabrication process illustrated in FIG. 9 according to embodiments of the disclosure.
Figure 11:
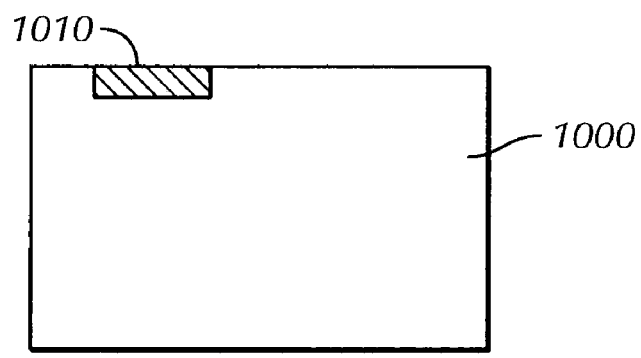
Figure 12:
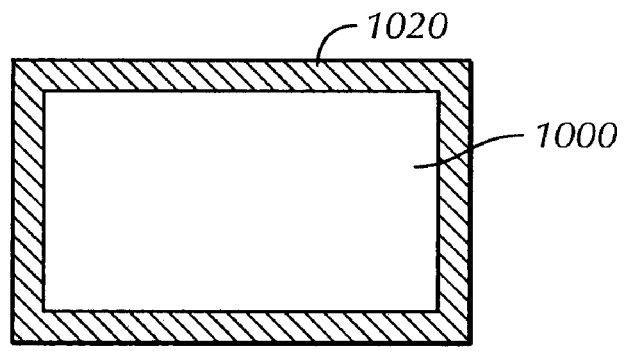
Figure 13:
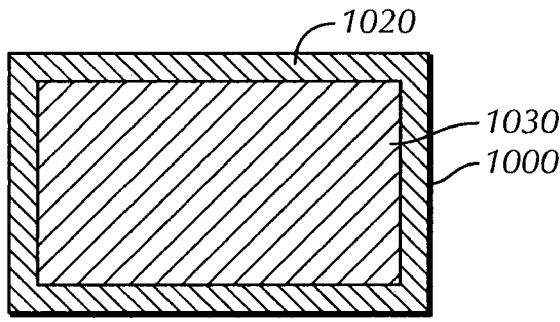
Figure 14:
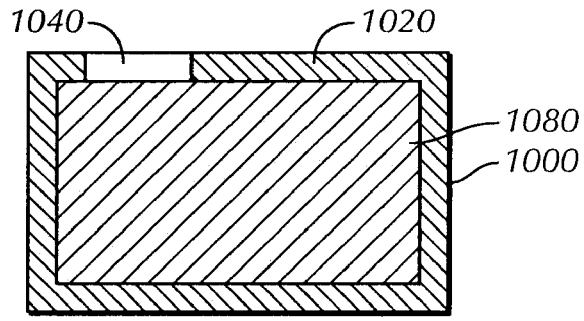

FIG. 10 shows a top view of an exemplary touch sensor panel 1000 having patterned ITO (or other conductive material) and metal layers (the patterns are not shown in this figure) deposited on its surface. The patterning can be performed by a traditional litho/etch process or other processes. In the next step, as shown in FIG. 11, a temporary mask (e.g., a strip mask) 1010 can be placed over the bonding area of the touch sensor panel 1000 to protect the underlying metal layer in that area. Once the temporary mask is in place, the resist/passivation layer 1020 can be printed over the entire edge area of the panel 1000, as shown in FIG. 12. Because the bonding area is covered by the temporary mask 1010 (not shown in FIG. 12), the resist/passivation layer 1020 is not directly affixed to the metal layer in that particular area. Instead, the resist/passivation layer 1020 is affixed to the temporary mask 1010. FIG. 13 illustrates another metal litho/etch step to remove metal patterns from the viewing area 1030 of the panel 1000, although in other embodiments processes other than litho/etch may also be used to remove the metal. After etching, only the ITO (or other conductive material) patterns 1080 may remain in the viewing area 1030. As described above, because the resist/passivation layer material can also act as the passivation layer, it is not removed after the metal litho/etch step. To expose the metal layer in the bonding area 1040 for the subsequent flex bonding process, the temporary mask can be peeled off or otherwise removed to expose the bonding area 1040, as illustrated in FIG. 14. This can remove the resist/passivation layer over the bonding area together with the temporary mask because they are affixed to each other. During the flex bonding process, a flex circuit can be bonded to the metal layer in the bonding area 1040. Because the temporary mask can be relatively inexpensive, using it to temporarily prevent the metal layer in the bonding area from being removed during etching may not significantly increase material cost of the whole fabrication process or diminish the benefit of employing the fabrication process disclosed in the embodiments above.

Figure 15:
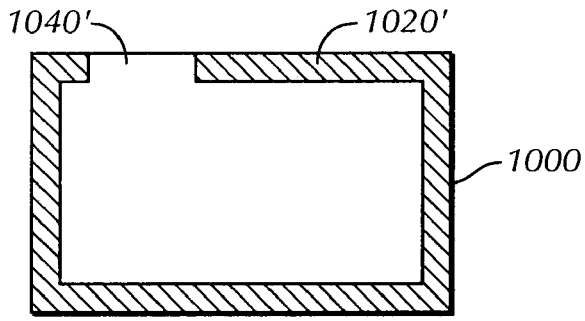
FIGS. 15 and 16 illustrate the exemplary steps of another method of preserving a bonding area for flex bonding during the fabrication process illustrated in FIG. 9 according to embodiments of the disclosure.
Figure 16:
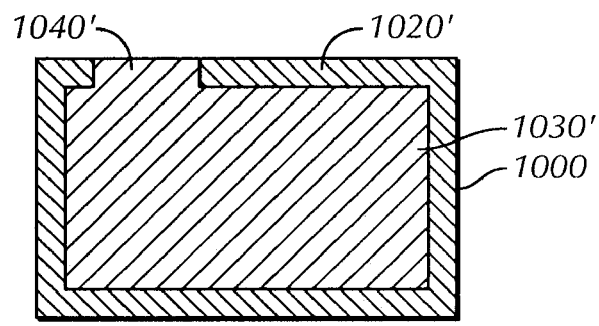

The second method to ensure that the bonding area is preserved during and after passivation is to avoid printing the resist/passivation material over the bonding area altogether. As illustrated in FIG. 15, after litho/etch (or other similar process) is performed on the metal and ITO (or other conductive material) layers to form patterns, the resist/passivation material 1020' can be printed over the edge areas of the panel except for the section 1040' to be preserved for flex bonding later in the fabrication process, leaving the metal layer in the bond area 1040' exposed. Next, a second metal litho/etch (or other similar process) can be performed to remove metal in the area not protected by the resist/passivation material 1020'. As shown in FIG. 16, this litho/etch process not only removes metal patterns in the viewing area 1030', but also the metal layer in the bonding area 1040', because the bonding area 1040' is not protected by the resist/passivation material 1020' in this embodiment. As a result, the patterned ITO (or other conductive material) layer is the layer exposed in both the viewing area 1030' and the bonding area 1040'. The flex circuit can be bonded directed to the exposed ITO layer in the bonding area 1040' in this embodiment.

Figure 17:
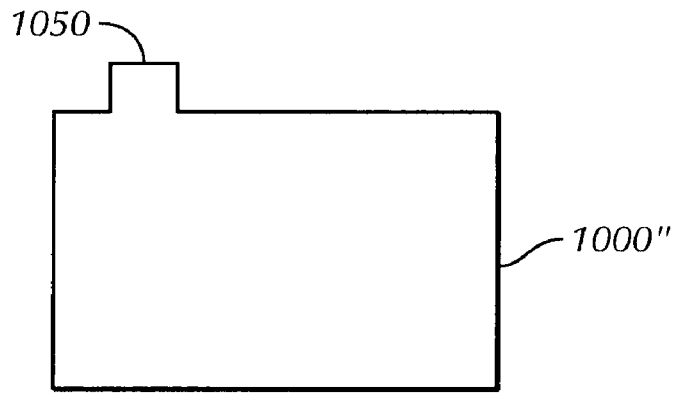
FIGS. 17-19 illustrate the exemplary steps of yet another method of preserving a bonding area for flex bonding during the fabrication process illustrated in FIG. 9 according to embodiments of the disclosure.
Figure 18:
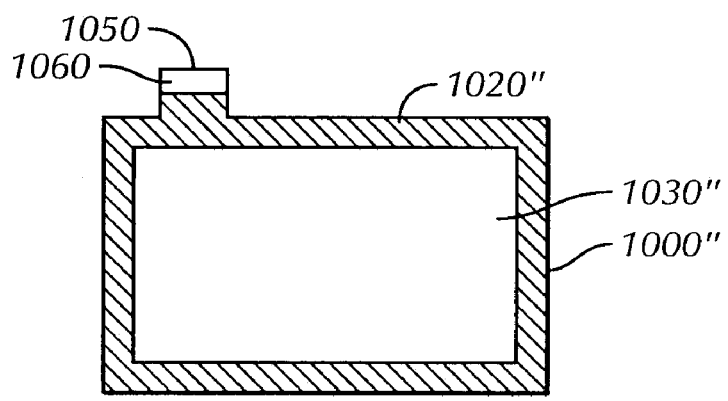
Figure 19:
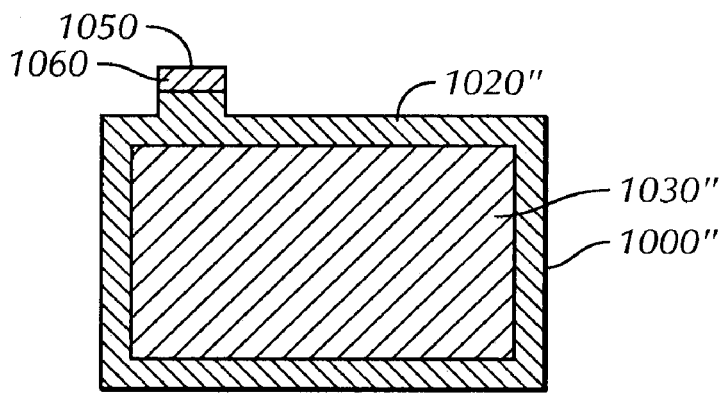

In the third embodiment, the flex bonding area can be preserved in an extended area 1050 of the touch sensor panel 1000" instead of within the edge area 1040 as in the previous embodiments. As shown in FIG. 17, the extended area 1050 can be a "flex tail" 1050 extending from one side of the touch sensor panel 1000". In this embodiment, an ITO (or other conductive material) layer and a metal layer can be deposited over the surface of the touch sensor panel 1000" including the surface of the extended area 1050. The first litho/etch step (or similar process) can be performed as usual to form patterns in the ITO and metal layers. As shown in FIG. 18, the resist/passivation material 1020" can be printed over the edge areas 1020" of the touch sensor panel 1000" and optionally over part of the extended area (i.e., the "flex tail") 1050, prior to etching off the metal pattern in the viewing area 1030" of the panel. At least a part 1060 of the extended area 1050 can be left uncovered by the resist/passivation layer 1020". A second litho/etch step (or other similar process) can remove the metal in the viewing areas 1030 and the part 1060 of the extended area (i.e., the "flex tail") 1050 not covered by the resist/passivation material 1020". As shown in FIG. 19, the patterned ITO (or other conductive material) layer can be exposed in those exposed areas 1030", 1060. As such, a flex circuit can be bonded directly to the ITO layer of the unprotected part 1060 of the extended area 1050 during the subsequent flex bonding process.

The three embodiments discussed above can allow the resist/passivation material to be permanently placed over the touch sensor panel while still preserving at least an area on the surface of the panel (or an extended area of the panel) for flex bonding.

Figure 20A:
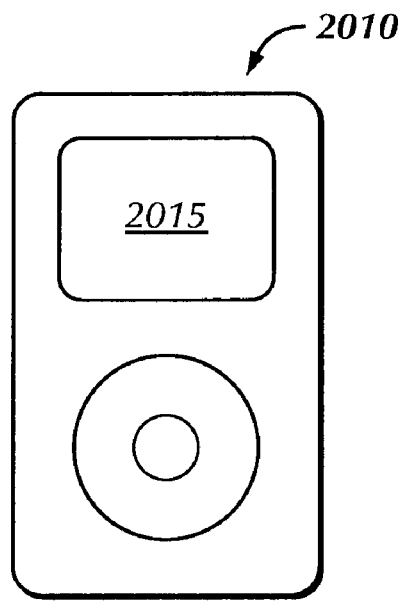
FIG. 20a illustrates an exemplary digital media player having a SITO or DITO touch sensor panel fabricated according to embodiments of the disclosure.

FIG. 20a illustrates exemplary digital media player 2010 that can include a touch sensor panel 2015 fabricated according to embodiments of the disclosure.

Figure 20B:
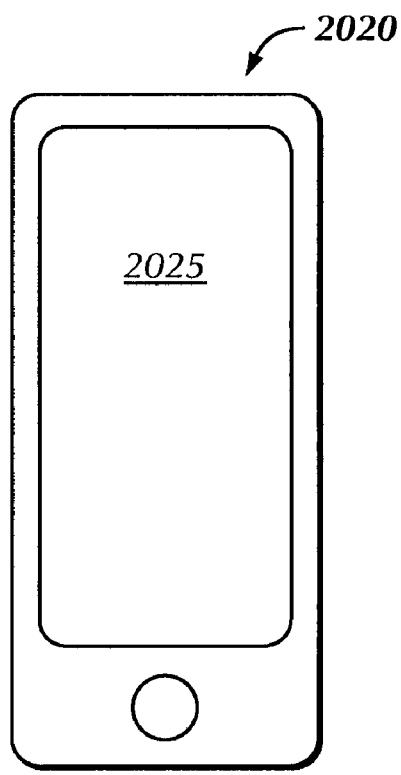
FIG. 20b illustrates an exemplary mobile telephone having a SITO or DITO touch sensor panel fabricated according to embodiments of the disclosure.

FIG. 20b illustrates exemplary mobile telephone 2020 that can include a touch sensor panel 2025 fabricated according to embodiments of the disclosure.

Figure 20C:
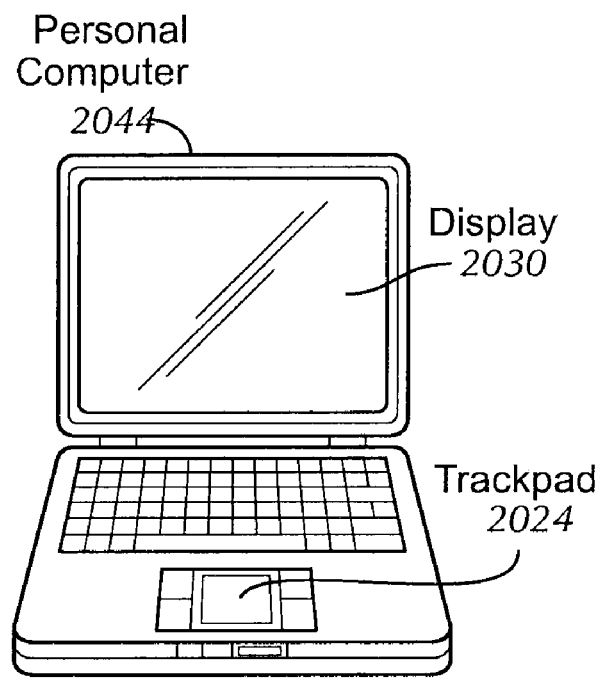
FIG. 20c illustrates an exemplary mobile computer having a SITO or DITO touch sensor panel fabricated according to embodiments of the disclosure.

FIG. 20c illustrates an exemplary personal computer 2044 that can include touch sensor panel 524 and display device 2030. The touch sensor panel 2024 can be a SITO/DITO or other panel fabricated according to embodiments of the disclosure. The display device 2030 can also include a SITO/DITO or other panel fabricated according to embodiments of the disclosure.

Figure 20D:
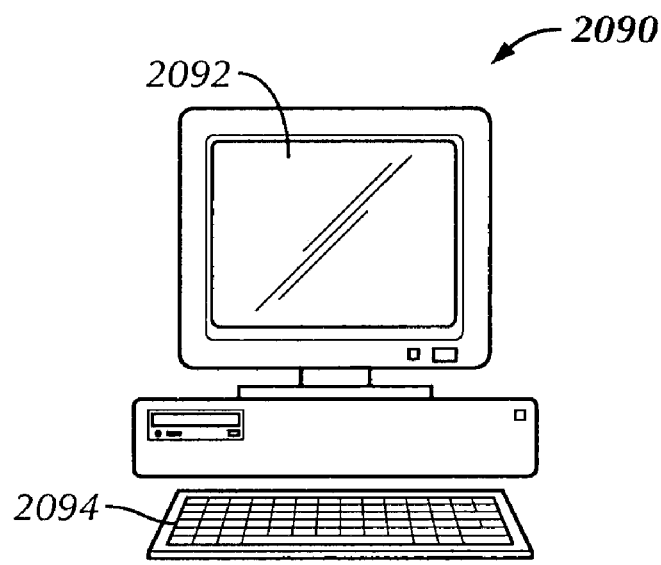
FIG. 20d illustrates an exemplary desktop computer having a SITO or DITO touch sensor panel fabricated according to embodiments of the disclosure.

FIG. 20d illustrates a desktop computer 2090 including a display device 2092. The display device 2092 may include a SITO/DITO or other panel fabricated according to embodiments of the disclosure. The desktop computer 2090 may also include a virtual keyboard 2094 which incorporates a SITO/DITO or other panel fabricated according to embodiments of the disclosure.

Figure 21:
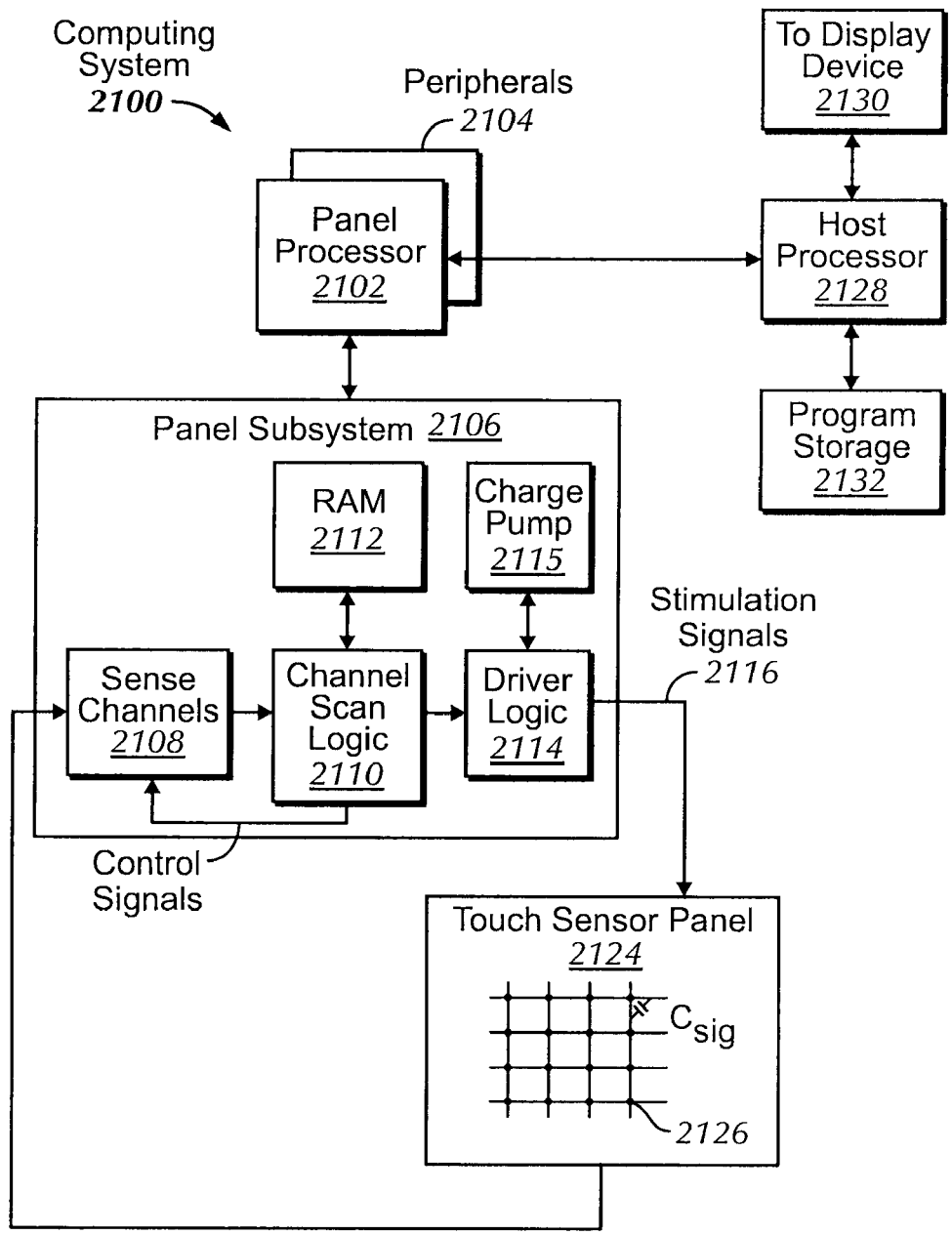
FIG. 21 illustrates an exemplary computing system including a touch sensor panel fabricated according to embodiments of the disclosure.

FIG. 21 illustrates exemplary computing system 2100 that can include one or more DITO/SITO or other touch sensor panels fabricated according to the embodiments of the disclosure described above. Computing system 2100 can include one or more panel processors 2102 and peripherals 2104, and panel subsystem 2106. Peripherals 2104 can include, but are not limited to, random access memory (RAM) or other types of memory or storage, watchdog timers and the like. Panel subsystem 2106 can include, but is not limited to, one or more sense channels 2108, channel scan logic 2110 and driver logic 2114. Channel scan logic 2110 can access RAM 2112, autonomously read data from the sense channels and provide control for the sense channels. In addition, channel scan logic 2110 can control driver logic 2114 to generate stimulation signals 2116 at various frequencies and phases that can be selectively applied to drive lines of touch sensor panel 2124. In some embodiments, panel subsystem 2106, panel processor 2102 and peripherals 2104 can be integrated into a single application specific integrated circuit (ASIC).

Touch sensor panel 2124 can include a capacitive sensing medium having a plurality of drive lines and a plurality of sense lines, although other sensing media can also be used. Either or both of the drive and sense lines can be coupled to a thin glass sheet according to embodiments of the disclosure. Each intersection of drive and sense lines can represent a capacitive sensing node and can be viewed as picture element (pixel) 2126, which can be particularly useful when touch sensor panel 2124 is viewed as capturing an "image" of touch. (In other words, after panel subsystem 2106 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 2124 can drive sense channel 2108 (also referred to herein as an event detection and demodulation circuit) in panel subsystem 2106.

Computing system 2100 can also include host processor 2128 for receiving outputs from panel processor 2102 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 2128 can also perform additional functions that may not be related to panel processing, and can be coupled to program storage 2132 and display device 2130 such as an LCD panel for providing a UI to a user of the device. Display device 2130 together with touch sensor panel 2124, when located partially or entirely under the touch sensor panel, can form touch screen 2118.

Note that one or more of the functions described above can be performed by firmware stored in memory (e.g. one of the peripherals 2104 in FIG. 21) and executed by panel processor 2102, or stored in program storage 2132 and executed by host processor 2128. The firmware can also be stored and/or transported within any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Although embodiments of this disclosure have been fully described with reference to the accompanying drawings, it is to be noted that various changes and modifications will become apparent to those skilled in the art. Such changes and modifications are to be understood as being included within the scope of embodiments of this disclosure as defined by the appended claims.

What is claimed is:

1. A method for fabricating a touch sensor panel, comprising:
   providing a substrate for the touch sensor panel;
   depositing a conductive material layer on a top surface of the substrate;
   depositing a metal layer on top of the conductive material layer;
   applying a temporary strip mask over a bonding area of the first area of the metal layer;
   affixing a resist to a first area of the metal layer and the temporary strip mask, the resist also adapted to serve as a passivation layer during passivation;
   removing metal from the metal layer outside of the first area; and
   performing passivation on the substrate while leaving the affixed resist intact.

2. The method of claim 1, wherein the resist in a photoresist.

3. The method of claim 1, wherein the resist is a heat resist.

4. The method of claim 1, wherein the removing of metal from the metal layer is by photolithography.

5. The method of claim 1, wherein the removing of metal from the metal layer is by etching.

6. The method of claim 1, wherein the substrate is polyethylene terephthalate (PET).

7. The method of claim 1, wherein the substrate is polycarbonate (PC).

8. The method of claim 1, further comprising:
   removing the temporary strip mask and the resist affixed thereto over the bonding area to expose the bonding area for flex circuit bonding.

9. The method of claim 1, further comprising bonding a flex circuit to the bonding area.

10. The method of claim 1, wherein the conductive material layer and the metal layer are deposited simultaneously.

11. The method of claim 1, wherein the metal layer is copper.

12. The method of claim 1, wherein the conductive material layer is ITO.

13. The method of claim 1, wherein the first area of the metal layer excludes a bonding area reserved for flex circuit bonding.

14. The method of claim 13, wherein the bonding area is located on an extended area of the touch sensor panel.

15. The method of claim 13, further comprising bonding a flex circuit to the bonding area.

16. The method of claim 1, further comprising patterning the conductive material layer and the metal layer to form drive and sense elements of the touch sensor panel.

17. The method of claim 16, wherein the patterning uses dry film resist (DFR).

18. The method of claim 16, wherein the patterning is by etching.

19. A method for fabricating a touch sensor panel, comprising:
    forming a plurality of traces on a substrate;
    applying a temporary strip mask over a bonding area of a first portion of the traces;
    depositing a first material over a first portion of the traces and the temporary strip mask, the first material adapted to serve as both a photoresist and a passivation layer;
    removing those traces not covered by the first material; and
    passivating the substrate while leaving the deposited first material intact.

20. The method of claim 19, wherein the removing of the traces is by lithography.

21. The method of claim 19, wherein the removing of the traces is by etching.

22. The method of claim 19, further comprising:
    removing the temporary strip mask and the first material affixed thereto over the bonding area to expose the bonding area for flex circuit bonding.

23. The method of claim 19, wherein the traces are made of copper.

24. The method of claim 19, wherein the first portion of the traces excludes a bonding area reserved for flex circuit bonding.

25. The method of claim 24, wherein the bonding area is located on an extended area of the touch sensor panel.

\* \* \* \* \*